Figure 1:
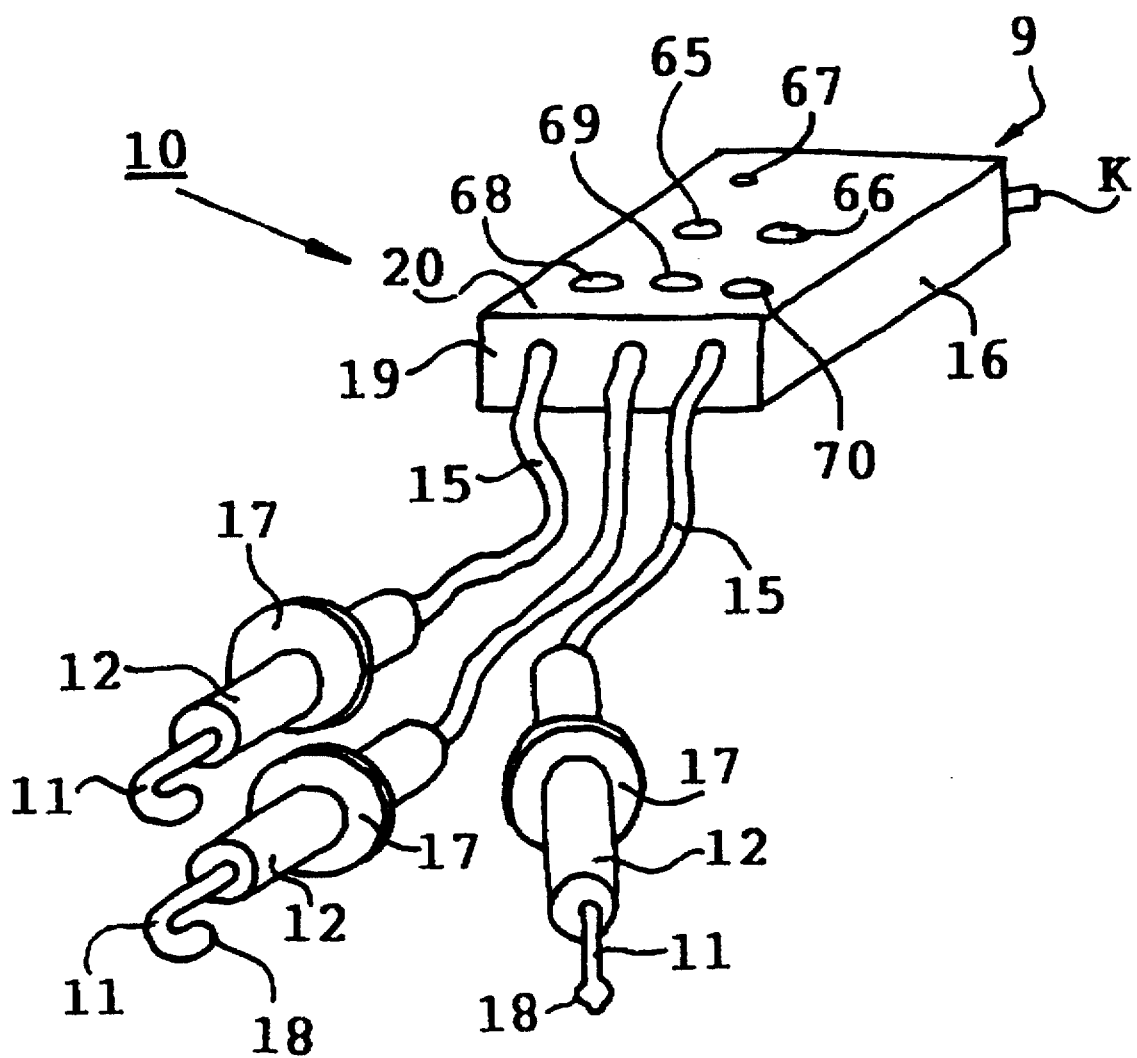

United States Patent [19]

Alahuhtala

[11] Patent Number: 5,714,889
[45] Date of Patent: Feb. 3, 1998

[54] METHOD AND DEVICE FOR INDICATING THE DIRECTION OF ROTATION OF A THREE-PHASE SYSTEM

[75] Inventor: Jorma Alahuhtala, Säkylä, Finland

[73] Assignee: Oy Sekko AB, Porvoo, Finland

[21] Appl. No.: 356,333

[22] PCT Filed: Jun. 22, 1993

[86] PCT No.: PCT/FI93/00267

§ 371 Date: Dec. 20, 1994

§ 102(e) Date: Dec. 20, 1994

[87] PCT Pub. No.: WO94/00770

PCT Pub. Date: Jan. 6, 1994

[30] Foreign Application Priority Data

Jun. 22, 1992 [FI] Finland ................ 922892

[51] Int. Cl.[6] .......................... G01R 31/34; G01R 25/00
[52] U.S. Cl. .......................... 324/772.1; 324/108
[58] Field of Search .............. 324/772, 86, 108; 361/76; 364/481; 307/127

[56] References Cited

U.S. PATENT DOCUMENTS

| | | | |
|---|---|---|---|
| 1,669,159 | 5/1928 | Duncan, Jr. et al. | 324/86 |
| 2,128,019 | 8/1938 | Sleeper | 324/86 |
| 3,825,768 | 7/1974 | Grygera | 307/127 |
| 3,976,919 | 8/1976 | Vandevier et al. | 361/76 |
| 4,028,686 | 6/1977 | Wilson et al. | 361/76 |
| 4,710,703 | 12/1987 | Harkiewicz et al. | 324/86 |
| 4,804,922 | 2/1989 | Sometani et al. | 324/108 |
| 4,879,509 | 11/1989 | Sometani et al. | 324/86 |
| 5,378,979 | 1/1995 | Lombardi | 324/86 |

FOREIGN PATENT DOCUMENTS

| | | |
|---|---|---|
| 2625278 | 12/1976 | Germany. |
| 2845538 | 4/1980 | Germany. |
| 2059078 | 9/1979 | United Kingdom. |

*Primary Examiner*—Ernest F. Karlsen
*Attorney, Agent, or Firm*—Nixon & Vanderhye P.C.

[57] ABSTRACT

A method and measuring device are provided for measuring the direction of rotation of a three-phase system. The measurement is carried out by measuring sensors. A coupling circuit is connected to each measuring sensor and transforms the voltage produced in the measuring sensor into rectangular pulses. The coupling circuit outputs are connected to a common logic device which determines the direction of rotation on the basis of the phase difference between the pulses.

20 Claims, 3 Drawing Sheets

5,714,889

METHOD AND DEVICE FOR INDICATING THE DIRECTION OF ROTATION OF A THREE-PHASE SYSTEM

This application is a 371 of PCT/FI93/00267, filed Jun. 22, 1993.

The object of the invention is a method and measuring device for measuring the direction of rotation of a three-phase system, the measurement being carried out by means of measuring sensors.

An electrical voltage with a varying direction is called alternating voltage. Periodic alternating voltage is a voltage, the variation of which is repeated in similar form at certain intervals.

If a coil is rotated at constant angular speed in a homogenous magnetic field, a sinusoidal supply voltage is induced. A one-phase system is achieved when the coil is connected to a loading circuit. If coils are placed on the surface of a rotor at random, and a separate loading circuit is connected to each coil, a multiphase system is achieved.

The multiphase system is symmetrical if all its supply voltages are equally high and if the phase angle difference between the supply voltages is equal; otherwise it is asymmetrical.

The most common symmetrical multiphase system is the three-phase system. Since the number of phases of the system is three, the angle difference between the phase coils of the generator is 120°. As the positive direction of the supply voltages to be induced in phase coils we can select the direction from the end of the phase to its beginning. The phase sequence is then 1, 2, 3. If the rotor's direction of rotation is changed, the phase sequence becomes negative: 1, 3, 2.

By connecting three circuits together, the conductors can be partly shared by the different circuits. An electricity source for alternating current or an electrical apparatus to be connected to an electrical instrument is connected by joining either the beginnings or ends of the phase coils into a star point; similarly, in serial connection, the electrical apparatus is connected by joining the phase coils into a closed ring by always connecting the end of a phase coil to the beginning of the following phase coil.

At present, measuring the direction of rotation of a voltage in field conditions—when connecting electrical apparatus and installing new apparatus—is carried out galvanically on the live parts of a three-phase system, the measurement thus having to be done on bare conductor surfaces. The conductor insulation on the conductor surface has to be peeled off, and to the bare conductor surface is fastened a so-called alligator clamp or the like, which is connected to the measuring device through a conductor.

The disadvantages of the above known method are that the manner of measuring is not occupationally safe and carrying out the measurement alone in field conditions is difficult. In addition, the traditional measuring device must be connected when de-energized, that is, the supply of electricity must be disconnected for a moment.

The aim of the present invention is to eliminate the above-mentioned problems and to achieve a new method and measuring device which facilitate measurements in field conditions, and which are at the same time occupationally safe.

It is characteristic of the method relating to the invention that a measuring sensor operating on the electrostatic principle is mounted adjacent to each three-phase system wire, that the alternating voltage produced in the measuring sensors is transformed by means of an electronic coupling circuit or the like into rectangular pulses, that the pulse sequences obtained from all measuring sensors are transmitted to a logic circuit or microprocessor circuit which determines the direction of rotation on the basis of the phase difference between the pulses.

It is characteristic of the device relating to the invention that, after each measuring sensor a coupling circuit is connected, transforming the voltage produced in the measuring sensor into rectangular pulses, and that the coupling circuit outputs are connected to a common logic or microprocessor which determines the direction of rotation on the basis of the phase difference between the pulses.

By means of the invention a measuring device is achieved, with which the direction of rotation can be measured on the conductor insulation surface, without galvanic contact. When the device is used, the conductor insulation on the conductors leading to the electrical appliance does not have to be removed, which at the same time facilitates and speeds up the measurement of the direction of rotation. Measurement can thus be carried out on a live wire, merely taking into account the safety distances complying with safety regulations.

The invention is exemplified in the following with reference to the accompanying drawings, in which FIG. 1 shows an axonometric view of the measuring device relating to the invention.

Figure 2:
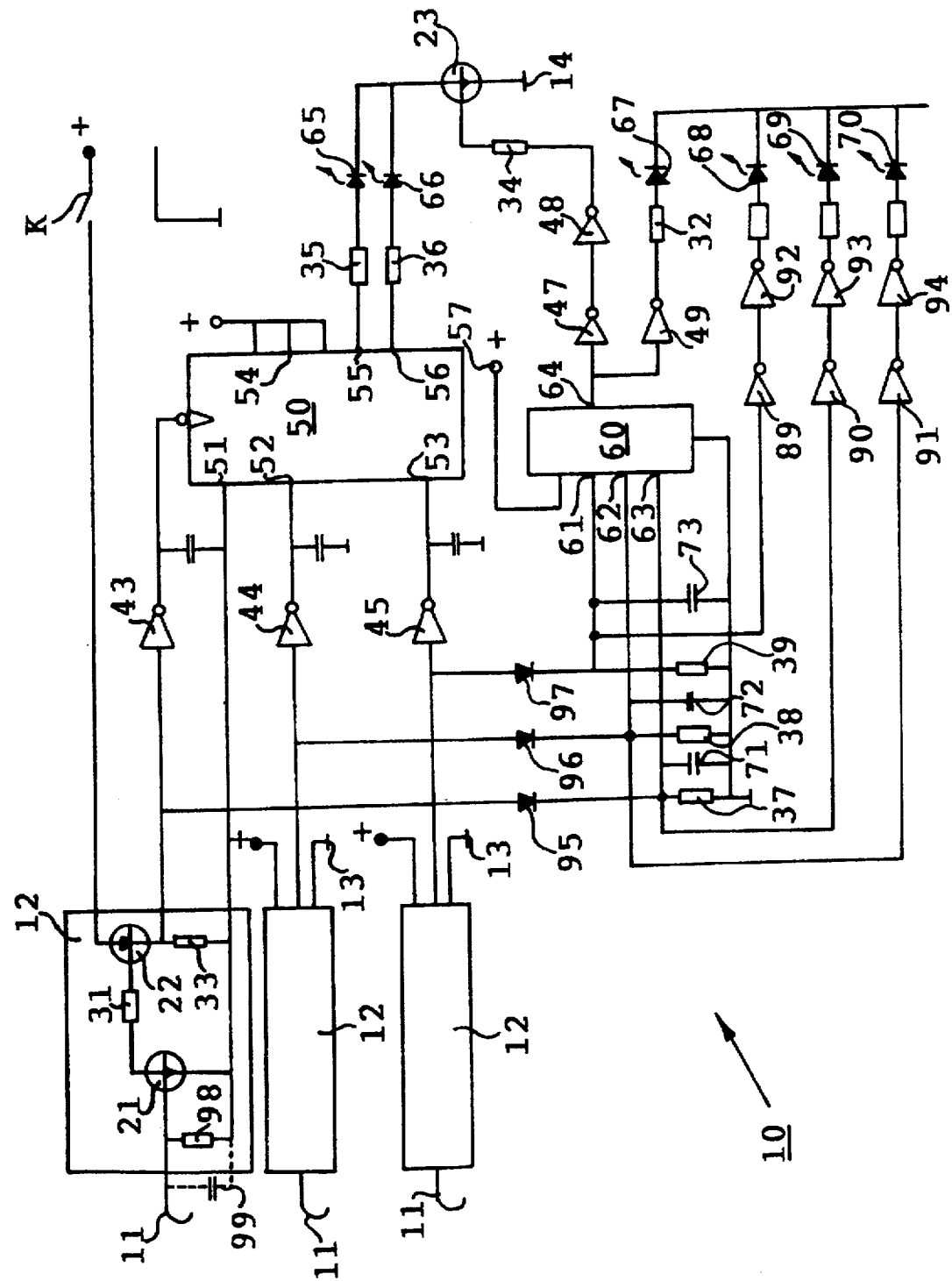
Figure 3:
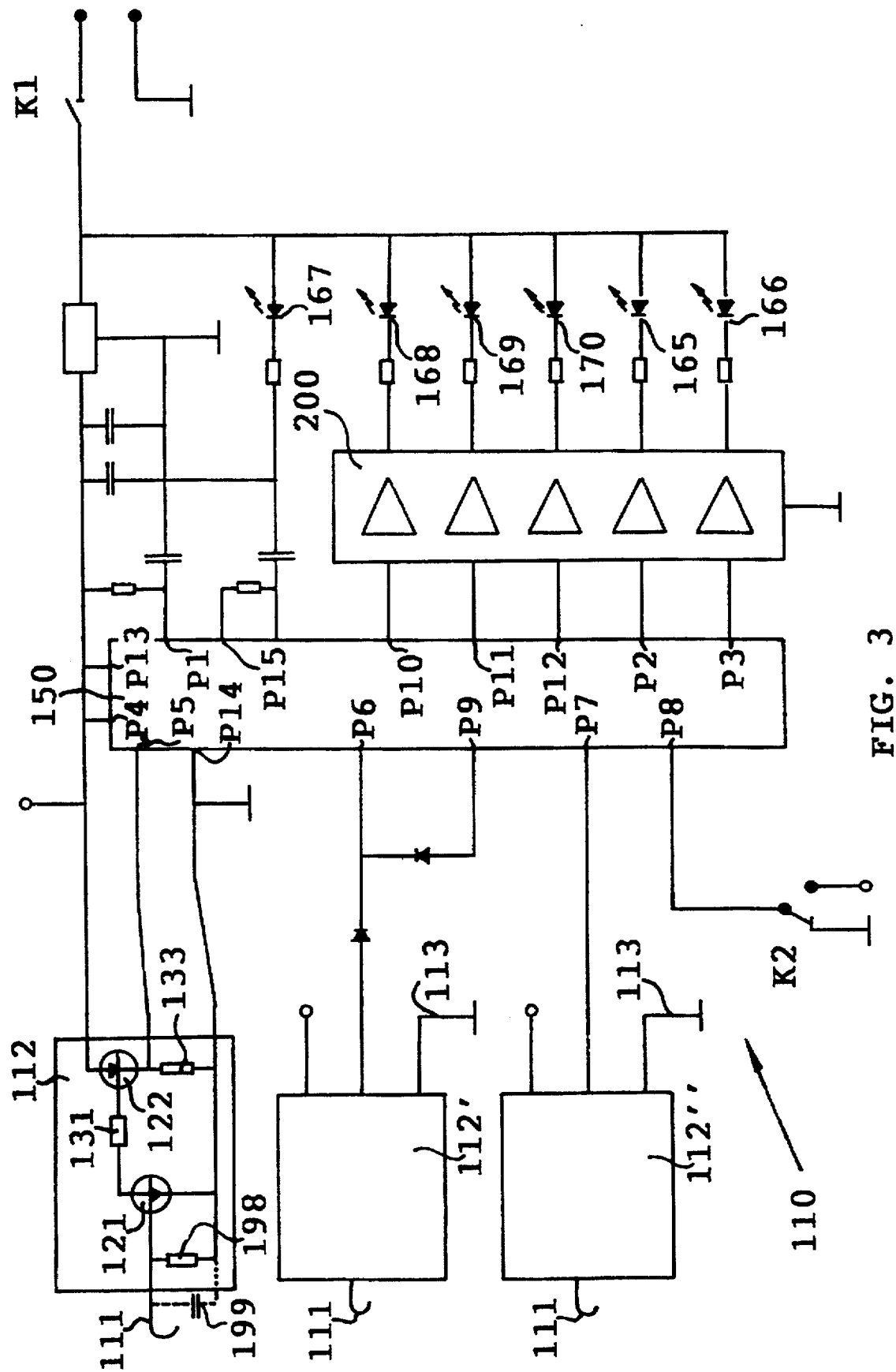

FIG. 2 shows a diagrammatic view of the operating principle of the measuring device relating to the invention, and FIG. 3 shows a diagrammatic view of the operating principle of the second measuring device embodiment relating to the invention.

FIG. 1 shows an axonometric view of the measuring device 10 for measuring the direction of rotation of the voltage of a three-phase system. The measuring device 10 is intended for measuring the direction of rotation of a three-phase system electrostatically, by means of measuring sensors 11. Due to the sensitivity of the device 10, the measuring sensor 11 can measure the direction of rotation of the voltage in the wire even at a distance of 4 cm.

The logic of the measuring device 10 is built into the housing 16. Manual devices 12 acting as the insulators of the measuring sensors 11 are connected through the front plate 19 of the housing 16 to the measuring circuit by means of wires 15. The ends of the measuring sensors 11 are bent in order to render them more suitable for fitting around the conductors or wires of the three-phase system. At the ends of the measuring sensors are fitted plugs 18. The manual devices 12 incorporate fixed stops 17 fitted at their centre, with the purpose of preventing the hand holding the device from coming into contact with the live wire being measured.

Inside the insulator casing of the manual devices 12 are installed some of the electronics required for measuring, including for example the transistor 21 connected to the measuring sensor 11, a resistor 31 and a transistor 22, as shown in FIG. 2. After each measuring sensor 11 is thus connected a coupling circuit, 21 and 22, which transforms the voltage produced in the measuring sensor 11 into rectangular pulses. The outputs of the coupling circuits 21 and 22 are connected to the logic built into a common housing 16, the said logic indicating the direction of rotation on the basis of the phase difference between pulses.

The housing 16 contains the measuring logic of the actual measuring device 10 shown in FIG. 2. On the cover plate 20 are fixed leds 68, 69 and 70, identifying the different phases by means of signal lamps. The leds provided with red 65 and green 66 signal lamps indicate whether the direction of voltage of a three-phase system being measured is correct or incorrect. The signal lamp 67 shows readiness for operation and, when illuminated, indicates that the measuring logic is not ready for operation. With the help of the signal lamp 67 it can be concluded whether the voltage of the battery acting as the power source for the measuring device is sufficient. The signal lamp 67 goes out when the measuring device 10 indicates the direction of rotation. To the side 9 of the housing 16 is attached the power switch K of the measuring device 10. The measuring device 10 operates on both 110 V and 220 V voltages.

FIG. 2 shows a diagrammatic view of the operating principle of an embodiment of a measuring device relating to the invention. When the measuring sensor 11 in the manual device 12 of the measuring device 10 for measuring the static direction of rotation is brought into the vicinity of an alternating voltage conductor, the transistor 21 in the manual device 12 opens, thus producing a base voltage in the transistor 22 over the resistor 31, and making the transistor 22 conductive. The current can then pass through the transistor 22 and the resistor 33 to the negative pole 13, 14. The circuit generating the base voltage of the NPN transistor 21 consists of a resistor 98 and, alongside the resistor 98, the capacitance of any point in the circuit to earth which is shown schematically and in broken line at 99 in FIG. 2.

When the sensor 11 of the manual device 12 is sufficiently close to the live conductor, that is, when the sensor is in a sufficiently high alternating voltage field, the voltage over the resistor 98 and the earth capacitance 99 rises higher than 0.6 V. As a result of this the transistor 21 becomes conductive, that is, opens. The transistor 21 opens only during the positive phase of the mains voltage, in which case a 50 Hz rectangular wave can be measured over the resistor 33. These rectangular waves are conducted from each phase of the measuring sensors 11, through amplifiers 43, 44 and 45 to an R/S trigger element 50.

The directions of rotation to be measured are indicated in such a way that the rectangular wave of each single phase in the three-phase system is conducted to the J-input 52 and K-input 53 and timer input 51 of the R/S trigger element 50, which triggers the S-output 55 or R-output 56 of the R/S trigger element 50, energizing one of them, depending on which one of the rectangular waves of the J-input 52 or K-input 53 is ahead of the other, that is, which phase voltage is ahead of the other at the moment of triggering, because the phase difference between the voltages of the three-phase system is always 120°. Triggering takes place on the falling edge of the pulse. After triggering the R/S trigger element 50 remains in the same state until the state of the J-input 52 or K-input 53 changes with respect to the moment of triggering.

By means of the above-described coupling arrangement, a direct voltage is produced in the R-output 56 or S-output 55 of the circuit formed by the R/S trigger element 50. This direct voltage is conducted through the resistors 36 or 35 to the leds 65 or 66 indicating the direction of rotation, and further through the transistor 23 to the negative pole 14.

By means of the transistor 33 and the AND gate 60, the leds 65 and 66 are prevented from lighting up until all three sensors 11 of the measuring device 10 have been connected to measure. Blocking is carried out so that the pulses of the sensors 11 are brought to the input pins 61, 62 and 63 of the AND gate, filtered through the circuit formed by the resistors 37, 38 and 39, and capacitors 71, 72 and 73 and also through the diodes 95, 96 and 97. Similarly, the positive operating voltage 57 is brought to the AND gate 60. After filtering, the voltages at the input pins 61, 62 and 63 of the AND gate can be seen as direct voltages at the AND gate 60.

The output 64 of the AND gate 60 is energized once all the input pulses have been connected and the positive operating voltage has been switched on by means of switch K, which means that through two inverting amplifiers 47 and 48, and through resistor 34, the transistor 23 receives base current and is energized, thus allowing the leds 65 and 66 to light up. The inverting amplifier 49 and resistor 32 in the output 64 of the AND gate 60, cause the led 67 indicating readiness for operation to light up, which, when illuminated, indicates that the measuring logic is not ready for operation. From the signal lamp led 67 it can at the same time be deduced that the battery has sufficient voltage. The signal lamp led 67 goes out when the measuring device 10 indicates the direction of rotation. The amplifiers 89–94 control the signal lamp leds 68, 69 and 70 which, when lighting up, indicate that the field received by the sensor 11 is of sufficient magnitude.

FIG. 3 shows a diagrammatic view of the operating principle of the second measuring device embodiment relating to the invention. Where applicable, the same reference numbers are used in the diagram of FIG. 3 as in FIG. 1, by merely adding the number "1" in front of the reference number.

After the measuring sensor 111 operating on the same principle as that shown in FIG. 2, a coupling circuit 121, 122 is connected, transforming the voltage produced in the measuring sensor into rectangular pulses. The outputs 121, 122 of the coupling circuit are connected to a common microprocessor built into a housing, the microprocessor determining the direction of rotation on the basis of the phase difference between the pulses.

The housing corresponds to the housing shown in FIG. 1 and on its cover plate are fixed leds 168, 169 and 170 identifying different phases by means of signal lamps. The leds provided with red 165 and green 166 signal lamps indicate whether the direction is correct or incorrect. The signal lamp 167 indicates the battery's readiness for operation. As in FIG. 1, to the side of the housing is attached the power switch K of the measuring device 110. The measuring device 110 operates on both 110 V and 220 V voltages. The measuring device can be used to establish the phases of two different systems having the same signs.

According to the operating principle of the measuring device shown in FIG. 3, the directions of rotation to be measured are indicated in such a way that the rectangular wave of each single phase in the three-phase system is conducted to the input gates p5, p6, and p7 of the microprocessor 150. The program in the processor 150 establishes the order in which the rectangular pulses come to the gates p5, p6 and p7, and on the basis of this determines from the 120° phase difference between the pulses the direction of rotation of the system. The program also controls the phase identification leds 168, 169 and 170, as guided by the gates p10, p11, and p12 of the processor 150, with the help of the amplifier 200.

The device relating to FIG. 3 can be provided with a "self test" function which checks, whenever power is switched to the device from switch K1, that the input gates of the processor 150 have not short-circuited for one reason or another. The testing is carried out so that the program conducts voltage from the processor gate p9 to gate p6, after which the processor reads the states of all input gates p5, p6, and p7 and lights up the leds 168, 169 and 170 identifying the phase, and keeps them illuminated for about 2 seconds. If the inputs of the device are in order, only led 169 may light up.

The measuring device can be used to find out the equiangular phases of two different systems by switching voltage by switch K2 to the input gate p8 which transfers the processor program to an area which checks for cophasality. Cophasality can be established by means of the sensors 112 and 112'. When the sensors are in the same phase, both leds 165 and 166 indicating the direction of rotation are lit up by the program, through the amplifier 200.

It is obvious to one skilled in the art that the different embodiments of the invention may vary within the scope of the claims presented below. Thus, for example in measuring sensors connected to measuring devices, micro circuits can be used instead of transistors.

I claim:

1. A measuring device for measuring the direction of rotation of a three-phase system, comprising:
   a plurality of electrostatic measuring sensors;
   a coupling circuit connected to each measuring sensor for transforming voltage induced in the measuring sensor to which it is connected into rectangular pulses, each said coupling circuit having an input connected to one of said electrosatic measuring sensors, and an output;
   a logic circuit, common to said coupling circuits, which determines direction of rotation based upon the phase differences between said pulses from each of said coupling circuits; and
   means for indicating the direction of rotation of the three-phase system; and
   wherein said logic circuit comprises a trigger element connecting said indicating means to said outputs of said coupling circuits, and an AND gate operatively connected to said indicating means and preventing said indicating means from being activated until all of said sensors are connected to said logic circuit.

2. A device as recited in claim 1 wherein said plurality of electrostatic measuring sensors comprises three sensors.

3. A device as recited in claim 2 wherein each of said electrostatic measuring sensors comprises an electrically conductive element having a hook-shaped free end, and an insulating material casing mounted to said conductive element spaced from said hook-shaped free end.

4. A device as recited in claim 3 wherein each of said insulating material casings contains therein a said coupling circuit, resistor, and earth capacitance; and further comprising a fixed stop mounted to a center portion of each of said insulating material casings.

5. A device as recited in claim 3 further comprising a housing enclosing said common logic circuit, said housing connected to said electrostatic measuring sensors and coupling circuits by wires extending from said insulating material casings thereto.

6. A device as recited in claim 1 wherein each coupling circuit comprises at least one transistor which becomes conductive in a positive or negative half-cycle of the voltage induced in the electrostatic measuring sensor with which it is associated.

7. A device as recited in claim 1 wherein said logic circuit includes a microprocessor.

8. A device as recited in claim 1 wherein said indicating means comprises a plurality of LEDs connected to said logic circuit for indicating the direction of rotation of the three-phase system; and wherein said logic circuit further comprises a transistor operatively connected to said AND gate and said LEDs through a filtering circuit, so that said LEDs are prevented from being energized until all of said sensors have been connected to said AND gate.

9. A device as recited in claim 8 further comprising a first signal lamp LED connected to said logic circuit in such a way that it is not energized when one of said direction of rotation LEDS is energized, and a plurality of other signal lamp LEDs operatively connected to said sensors so that energization of each of said signal lamp LEDs indicates that the sensor associated therewith is receiving a measurable induced voltage.

10. A measuring device for measuring the direction of rotation of a three-phase system, comprising:
    means for measuring the direction of rotation of a three-phase system having conductors with insulation thereon, without galvanic contact with the conductors, so that said insulation does not have to be removed, or with earth, said means comprising: a plurality of electrostatic measuring sensors; a coupling circuit connected to each measuring sensor for transforming voltage induced in the measuring sensor to which it is connected into rectangular pulses, each said coupling circuit having an input connected to one of said electrostatic measuring sensors, and an output; a logic common to said coupling circuits which determines direction of rotation based upon the phase differences between said pulses from each of said coupling circuits; and
    means for indicating the direction of rotation of the three-phase system; and
    wherein said logic circuit comprises a trigger element connecting said indicating means to said outputs of said coupling circuits, and an AND gate operatively connected to said indicating means and preventing said indicating means from being activated until all of said sensors are connected to said logic circuit.

11. A device as recited in claim 10 wherein each coupling circuit comprises at least one transistor which becomes conductive in a positive or negative half-cycle of the voltage induced in the electrostatic measuring sensor with which it is associated.

12. A device as recited in claim 10 wherein each of said electrostatic measuring sensors comprises an insulating material casing, and wherein each of said insulating material casings contains therein a said coupling circuit, as well as a resistor, and earth capacitance coupled to one of said electrostatic measuring sensors for providing a base voltage to the coupling circuit associated with that sensor; and further comprising a fixed stop mounted to a center portion of each of said insulating material casings.

13. A method of measuring the direction of rotation of a three-phase system having three conductive wires covered by electrical insulation, using three electrostatic measuring sensors, a plurality of LEDs indicating the direction of rotation of the three-phase system, and an AND gate; said method comprising the steps of:
    (a) bringing each electrostatic measuring sensor into close proximity to, but not galvanic contact with, one of the three conductive wires covered by electrical insulation during rotation of the three-phase system, rotation of the three-phase system inducing alternating voltage pulses in each of the sensors;
    (b) transforming the alternating voltage pulses from each of the sensors in step (a) into distinct rectangular pulses;
    (c) calculating the direction of rotation of the three-phase system by evaluating the phase differences between the distinct rectangular pulses from step (b);
    (d) preventing energization of the LEDs until all three sensors have been operatively connected to the AND gate; and (e) energizing the LEDs to indicate the direction of rotation calculated in the practice of step (c).

14. A method as recited in claim 13 wherein each of the sensors includes an electrically conductive element having a hook-shaped free end, and an insulating material casing mounted to the conductive element spaced from the hook-shaped free end; and wherein step (a) is practiced by manually holding and manipulating the insulating material casings to fit the hook-shaped free ends thereof around the wires of the three-phase system.

15. A method as recited in claim 13 wherein step (b) is practiced for each sensor by generating a base voltage in a first transistor, and transmitting an induced voltage from the sensor to a second transistor to make the second transistor conductive.

16. A method as recited in claim 13 utilizing a microprocessor with gates, and wherein step (c) is practiced by establishing the order that rectangular pulses are received by the gates of the microprocessor.

17. A method as recited in claim 13 utilizing an R/S trigger element having a J-input, K-input, and timer input, and an S-output and R-output; and wherein step (c) is practiced by conducting each rectangular wave from each sensor to the J, K, and timer inputs of the R/S trigger element, thereby triggering the S or R-outputs on the falling edge of a pulse energizing one of them, depending upon which one of the rectangular waves is received ahead of the other at the J or K-inputs at the moment of triggering.

18. A method as recited in claim 17 wherein step (c) is further practiced by maintaining the R/S trigger element in the same state until the state of the J or K-input changes with respect to the moment of triggering.

19. A method as recited in claim 17 further utilizing a resistor connected to LEDs indicating the direction of rotation of the three-phase system, the LEDs in turn connected through a transistor to a negative pole; and wherein step (c) is further practiced by conducting a direct voltage produced in the R or S-outputs through the resistor to the LEDs, indicating the direction of rotation, and then through the transistor to the negative pole.

20. A device as recited in claim 10 wherein said indicating means comprises a plurality of LEDs connected to said logic circuit for indicating the direction of rotation of the three-phase system; and wherein said logic circuit further comprises a transistor operatively connected to said AND gate and said LEDs through a filtering circuit, so that said LEDs are prevented from being energized until all of said sensors have been connected to said AND gate.

* * * * *